United States Patent
He (10) Patent No.: US 10,921,663 B2
(45) Date of Patent: Feb. 16, 2021

(54) ARRAY SUBSTRATE AND METHOD FOR FORMING THE SAME

(71) Applicants: HKC Corporation Limited, Shenzhen (CN); Chongqing HKC Optoelectronics Technology Co., ltd., Chongqing (CN)

(72) Inventor: Huailiang He, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/341,671

(22) PCT Filed: Aug. 15, 2018

(86) PCT No.: PCT/CN2018/100592
§ 371 (c)(1),
(2) Date: Apr. 12, 2019

(87) PCT Pub. No.: WO2019/037631
PCT Pub. Date: Feb. 28, 2019

(65) Prior Publication Data
US 2019/0384129 A1     Dec. 19, 2019

(30) Foreign Application Priority Data
Aug. 25, 2017   (CN) .......................... 201710741413.9

(51) Int. Cl.
*G02F 1/1362*   (2006.01)
*H01L 27/12*    (2006.01)
*H01L 27/146*   (2006.01)

(52) U.S. Cl.
CPC .. *G02F 1/136209* (2013.01); *G02F 1/136227* (2013.01); *H01L 27/127* (2013.01); *H01L 27/14612* (2013.01)

(58) Field of Classification Search
CPC ............. H01L 27/14612; H01L 27/127; H01L 29/7869; G02F 1/136209
See application file for complete search history.

(56) References Cited

U.S. PATENT DOCUMENTS

2012/0056184 A1*   3/2012   Park .................... H01L 27/3272
                                                       257/59

FOREIGN PATENT DOCUMENTS

CN          106992190 A    *  7/2017

OTHER PUBLICATIONS

Translated International Search Report of PCT/CN2018/100592 dated Feb. 28, 2019.*

(Continued)

*Primary Examiner* — Zandra V Smith
*Assistant Examiner* — John M Parker
(74) *Attorney, Agent, or Firm* — WPAT, PC (57) ABSTRACT

An array substrate is provided. The array substrate includes a substrate, a light-shielding layer formed on the substrate, a buffer layer formed on the light-shielding layer, a semiconductor layer formed on the buffer layer, a protection layer formed on the semiconductor layer, an insulating layer formed on the protection layer, and an interlayer dielectric layer formed on the protection layer. The substrate includes a source layer, a drain layer and a gate layer disposed thereon. The source layer and the drain layer are formed on the interlayer dielectric layer. The source layer and the drain layer are separately connected to conductor portions on two ends of the semiconductor layer. The insulating layer is disposed between the gate layer and the semiconductor (Continued)

layer. The interlayer dielectric layer is disposed to cover the gate layer and the protection layer. The insulating layer is disposed to cover the semiconductor layer.

14 Claims, 4 Drawing Sheets

(56) References Cited

OTHER PUBLICATIONS

English machine translation of CN106992190A filed Apr. 28, 2017 (Shenzen China Star Optoelectronics Technology).*

* cited by examiner

ARRAY SUBSTRATE AND METHOD FOR FORMING THE SAME

FIELD OF THE DISCLOSURE

The disclosure relates to a display technical field, and more particularly to an array substrate and a method for forming the same.

BACKGROUND

Displays are widely applied due to numerous advantages such as thin bodies, energy saving, radiation-free, etc. Most displays available on the market are backlight-type displays, and such display includes a display panel and a backlight module. The working principle of the display panel is placing liquid crystal molecules between two parallel substrates and loading a driving voltage on the two substrates to control rotation directions of the liquid crystal molecules, for refracting rays of the backlight module to generate images.

Thin Film Transistor-Liquid Crystal Display (TFT-LCD) has gradually dominated the display realm at present because of its properties such as low energy consumption, superior image quality and high production yield, etc. Identically, the TFT-LCD includes a display panel and a backlight module. The display panel includes a Color Filter Substrate (CF Substrate, also known as a color filter substrate) and a Thin Film Transistor Substrate (TFT Substrate). The opposite internal sides of these substrates have transparent electrodes. A layer of Liquid Crystal molecules (LC) is sandwiched between two substrates. In the display panel the orientation of the liquid crystal molecules is controlled by the electric field to change the polarization state of light. The penetration and blocking of optical path are controlled by the polarizing plate so as to achieve the purpose of display.

In the fabrication of a thin film transistor with a self-align top gate, it is necessary to perform a conductor (conductorized) treatment on the semiconductor layer. However, the semiconductor layer, which has undergone the conductor process, is significantly impacted in subsequent processes. The conductor effect of the semiconductor layer would be influenced such that the semiconductor layer does not meet the desired effect.

SUMMARY

The technical problem to be solved by the disclosure is to provide an array substrate which is effective in protecting the conductor effect of the semiconductor layer.

In addition, the disclosure also provides a method for forming an array substrate.

The objective of the disclosure is achieved by the following technical solutions:

An array substrate, wherein the array substrate comprises:
a substrate;
a light-shielding layer formed on the substrate;
a buffer layer formed on the light-shielding layer;
a semiconductor layer formed on the buffer layer;
a protection layer formed on the semiconductor layer;
an insulating layer formed on the protection layer; and an interlayer dielectric layer formed on the protection layer.

Wherein the substrate comprises a source layer, a drain layer and a gate layer disposed thereon. The source layer and the drain layer are formed on the interlayer dielectric layer. The source layer and the drain layer are separately connected to conductor portions on two ends of the semiconductor layer. The insulating layer is disposed between the gate layer and the semiconductor layer. The interlayer dielectric layer is disposed to cover the gate layer and the protection layer. The area covered by the protection layer is greater than the area covered by the insulating layer. The thickness of protection layer is less than the thickness of the insulating layer.

Wherein the protection layer covers the entire surface of the semiconductor layer. The protection layer comprises two via holes. The two via holes are disposed on two sides of the insulating layer. As a result of arranging the protection layer to completely cover the surface of the semiconductor layer, it is able to effectively protect the semiconductor layer. It is effective in preventing the exposed semiconductor layer, which has undergone the conductor treatment, from being significantly impacted in the subsequent processes. Therefore, it is effective in preventing the impedance of the semiconductor layer, which has undergone the conductor treatment, from turning large again. As a result, it can be ensured that the semiconductor layer meets the desired effect. Moreover, arranging the protection layer to completely cover the surface of the semiconductor layer can avoid defects. The defects would be induced by over-processing of the semiconductor layer in the conductor process. Therefore, it is ensured that the on-state current of active switches is stable. The display effect of the display panel is enhanced even further.

Wherein the orthogonal projection region of the protection layer on the substrate overlaps the orthogonal projection region of the semiconductor layer on the substrate. As a result of this arrangement, it can provide a region corresponding to the semiconductor layer with better protection. When the conductor treatment is performed on the semiconductor layer, the semiconductor layer can be effectively prevented from defects due to over-processing in the conductor process. Therefore, it is ensured that the on-state current of the active switches is stable. Moreover, such arrangement can effectively reduce consumable materials for manufacturing the array substrate. The production cost of the array substrate is greatly reduced. The market competitiveness of the display panel is enhanced even further.

Wherein the protection layer is made of the same material as the insulating layer. The protection layer and the insulating layer are an integrally formed structure. As a result, they can be formed by using one mask process in the manufacturing production without increasing the difficulty of the process and the number of mask. It can be ensured that the production capacity of the display panel is high such that the display panel has greater market competitiveness.

Wherein the source layer and the drain layer comprise a passivation layer disposed thereon. The passivation layer is disposed to cover the source layer and the drain layer. The passivation layer and the protection layer comprise the interlayer dielectric layer disposed therebetween. As a result of arranging the passivation layer to cover the active switches, it can effectively prevent gas spillage problems. The gas spillage problems would be induced by corrosion of the interlayer dielectric layer in the subsequent processes. The passivation layer can provide the interlayer dielectric layer with very good protection. Therefore, it is ensured that the display panel has longer lifetime and higher efficiency.

Wherein the semiconductor layer is made of an oxide semiconductor material. As a result, active switches are manufactured by using the oxide semiconductor material as the semiconductor layer. Such active switches have higher switching current ratio and higher field effect mobility. The response speed is fast. Larger drive current can be achieved. A display panel with a large area can be manufactured.

According to another aspect of the disclosure, the disclosure also provides an array substrate, and the array substrate comprises:
a substrate;
a light-shielding layer formed on the substrate;
a buffer layer formed on the light-shielding layer;
a semiconductor layer formed on the buffer layer;
a protection layer formed on the semiconductor layer;
an insulating layer formed on the protection layer; and
an interlayer dielectric layer formed on the protection layer.

Wherein the substrate comprises a source layer, a drain layer and a gate layer disposed thereon. The source layer and the drain layer are formed on the interlayer dielectric layer. The source layer and the drain layer are separately connected to conductor portions on two ends of the semiconductor layer. The insulating layer is disposed between the gate layer and the semiconductor layer. The interlayer dielectric layer is disposed to cover the gate layer and the protection layer. The area covered by the protection layer is greater than the area covered by the insulating layer. The thickness of protection layer is less than the thickness of the insulating layer. The protection layer covers the entire surface of the semiconductor layer. The protection layer comprises two via holes. The two via holes are disposed on two sides of the insulating layer. The orthogonal projection region of the protection layer on the substrate overlaps the orthogonal projection region of the semiconductor layer on the substrate. The source layer and the drain layer comprise a passivation layer disposed thereon. The passivation layer is disposed to cover the source layer and the drain layer. The passivation layer and the protection layer comprise the interlayer dielectric layer disposed therebetween. The protection layer is made of the same material as the insulating layer. The semiconductor layer is made of an oxide semiconductor material.

According to yet another aspect of the disclosure, the disclosure further provides a method for forming an array substrate. The method comprises the steps of:
providing a substrate;
forming a light-shielding layer on the substrate;
forming a buffer layer on the light-shielding layer;
forming a semiconductor layer on the buffer layer;
forming a protection material layer and an insulating material layer on the semiconductor layer;
using a mask to simultaneously obtain a protection layer and an insulating layer;
forming a gate layer on the insulating layer;
forming an interlayer dielectric layer on the protection layer and the gate layer; and
forming a source layer and a drain layer coupled to the semiconductor layer on the interlayer dielectric layer.

Wherein the area covered by the protection layer is greater than the area covered by the insulating layer. The thickness of protection layer is less than the thickness of the insulating layer.

As a result, the protection material layer and the insulating material layer are etched by using the same mask. The insulating material layer is first etched and then the protection material layer is etched so as to obtain the insulating layer and the protection layer. The protection layer can effectively ensure that a region of the semiconductor layer, which requires to be conductor, is not exposed. During the subsequent processes, it is effective in reducing impact on the impedance of the conductor portion of the semiconductor layer. Therefore, it is ensured that the on-state current of the active switches is stable. The display effect of the display panel is enhanced even further. Moreover, arranging the insulating layer to cover the semiconductor layer can effectively avoid over-processing of the semiconductor layer in the conductor process. Defect states are reduced even further. At the same time, such arrangement does not increase the difficulty of the process and the number of mask. There is no impact on the production capacity of the array substrate, either.

Wherein the formation of the source layer and the drain layer coupled to the semiconductor layer on the interlayer dielectric layer comprises:
using plasma to bombard the protection layer in a coupling region corresponding to the source layer and the drain layer;
etching the interlayer dielectric layer to form via holes connected to the coupling region;
coating a metal material layer on the interlayer dielectric layer, wherein the metal material layer is coupled to the semiconductor layer through the via holes; and
etching the metal material layer by performing a mask process to form the source layer and the drain layer.

Wherein the protection layer is made of the same material as the insulating layer.

In the disclosure, arranging the insulating layer to cover the semiconductor layer can effectively ensure that a region of the semiconductor layer, which requires to be conductor, is not exposed. During the subsequent processes, it is effective in reducing impact on the impedance of the conductor portion of the semiconductor layer. Therefore, it is ensured that the on-state current of the active switches is stable. The display effect of the display panel is enhanced even further. Moreover, arranging the insulating layer to cover the semiconductor layer can effectively avoid over-processing of the semiconductor layer in the conductor process. Defect states in the array substrate are reduced even further. At the same time, such arrangement does not increase the difficulty of the process and the number of mask. There is no impact on the production capacity of the array substrate, either.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings. The terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, it should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Figure 1:
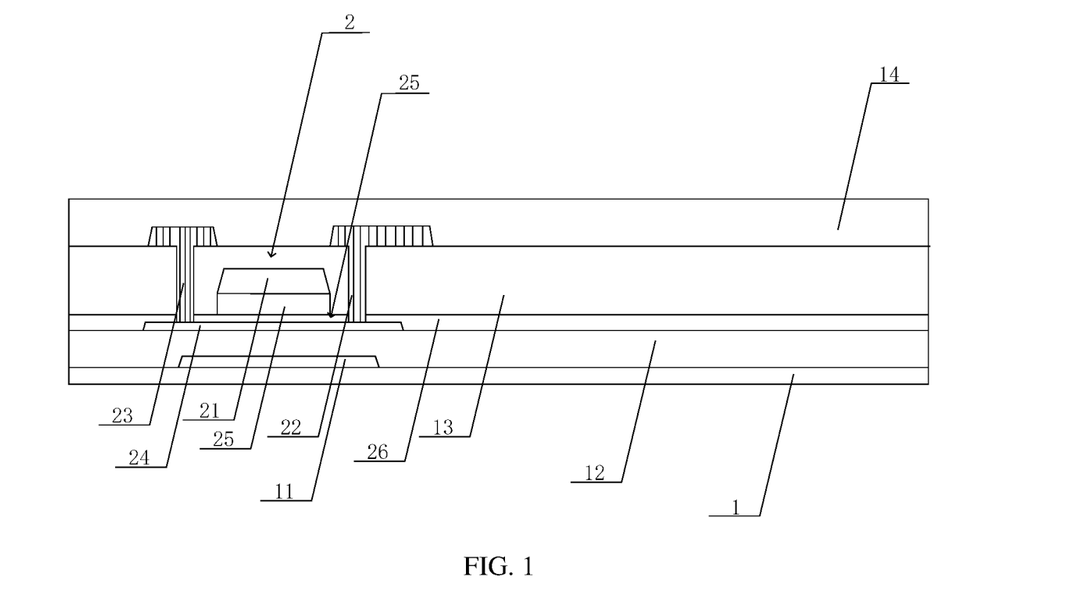
FIG. 1 is a structural schematic view of a partial cross-section of an array substrate according to an embodiment of the disclosure.

As shown in FIG. 1, the disclosure provides an array substrate. The array substrate comprises:
 a substrate;
 a light-shielding layer formed on the substrate;
 a buffer layer formed on the light-shielding layer;
 a semiconductor layer formed on the buffer layer;
 a protection layer formed on the semiconductor layer;
 an insulating layer formed on the protection layer; and
 an interlayer dielectric layer formed on the protection layer.

Wherein the substrate comprises a source layer, a drain layer and a gate layer disposed thereon. The source layer and the drain layer are formed on the interlayer dielectric layer. The source layer and the drain layer are separately connected to conductor portions on two ends of the semiconductor layer. The insulating layer is disposed between the gate layer and the semiconductor layer. The interlayer dielectric layer is disposed to cover the gate layer and the protection layer. The area covered by the protection layer is greater than the area covered by the insulating layer. The thickness of protection layer is less than the thickness of the insulating layer.

By arranging an insulating layer 25 to cover a semiconductor layer 24, it can be effectively ensured that a region of the semiconductor layer 24, which requires to be conductor, is not exposed. During the subsequent processes, it is effective in reducing impact on the impedance of the conductor portion of the semiconductor layer 24. Therefore, it is ensured that the on-state current of the active switches 2 is stable. The display effect of the display panel is enhanced even further. Moreover, arranging the insulating layer 25 to cover the semiconductor layer 24 can effectively avoid over-processing of the semiconductor layer in the conductor process. Defect states in the array substrate are reduced even further. At the same time, such arrangement does not increase the difficulty of the process and the number of mask. There is no impact on the production capacity of the array substrate, either.

A substrate 1 comprises an active switch 2 formed thereon. The active switch 2 comprises a semiconductor layer 24. Currently, the material of the semiconductor layer 24 comprises amorphous silicon (a-Si), oxide, polysilicon (Poly-Si), and so on. Compared with amorphous silicon, the semiconductor layer 24 has a higher mobility and a lower current leakage. Although the polysilicon TFT has a much higher mobility, its cost is higher and it is not suitable for production lines of more than $6^{th}$ generation. The active switch 2 is manufactured by using an oxide semiconductor material as the semiconductor layer 24. The active switch 2 comprises commonly used structures such as an etching stop structure, a back-channel etching structure, a Co-planner Self-Align Top Gate, a Dual Gate, and so on. There is no need to consider channel etching problems in the co-planner self-align top gate. The self-aligning method can reduce the channel length and improve the resolution of panel.

In the fabrication of the active switch 2 with a self-align top gate, a conductor treatment is performed on the semiconductor layer 24 made of an oxide semiconductor material so as to form a required conductor region. However, one of the difficulties in the fabrication of the active switch 2 with the self-align top gate is that the impedance of the conductor region has direct impact on the on-state current of the active switch 2. The current conductor treatment usually uses an inert gas such as Ar, He, and so on, to physically bombard the surface of the semiconductor layer 24. Alternatively, it is doped with $NH_3$, $H_2$, and so on. However, even if the semiconductor layer 24 has better conductor effect, the exposed conductorized semiconductor layer 24 is greatly affected in the subsequent processes. As a result, its impedance would turn large again to a large extent. The expected effect cannot be achieved. In the disclosure, arranging the insulating layer 25 to cover the semiconductor layer 24 can effectively solve the impedance problem of the conductor region.

Wherein the protection layer 26 covers the entire surface of the semiconductor layer 24. The protection layer 26 comprises two via holes. The two via holes are disposed on two sides of the insulating layer 25. Arranging the protection layer 26 to completely cover the surface of the semiconductor layer 24 is able to effectively protect the semiconductor layer 24. It is effective in preventing the exposed semiconductor layer 24, which has undergone the conductor treatment, from being significantly impacted in the subsequent processes. Therefore, it is effective in preventing the impedance of the semiconductor layer 24, which has undergone the conductor treatment, from turning large again. As a result, it can be ensured that the semiconductor layer 24 meets the expected effect well. Moreover, arranging the protection layer 26 to completely cover the surface of the semiconductor layer 24 can avoid defects. The defects would be induced by over-processing of the semiconductor layer 24 in the conductor process. Therefore, it is ensured that the on-state current of the active switch 2 is stable. The display effect of the display panel is enhanced even further. The arrangement of the via holes facilitates performing the subsequent processes of the active switch 2. It is ensured that the active switch 2 works well with high efficiency.

Figure 2:
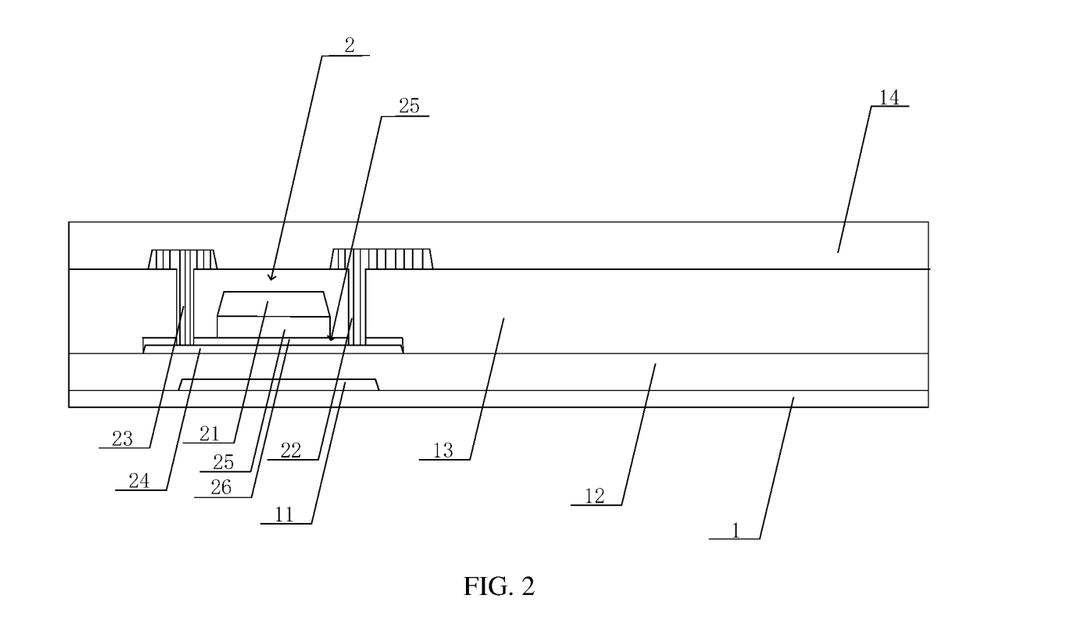
FIG. 2 is a structural schematic view of a partial cross-section of an array substrate according to an embodiment of the disclosure.

As shown in FIG. 2, the orthogonal projection region of the protection layer 26 on the substrate 1 overlaps the orthogonal projection region of the semiconductor layer 24 on the substrate 1. Using this arrangement can provide a region corresponding to the semiconductor layer 24 with better protection. When the conductor treatment is performed on the semiconductor layer 24, the semiconductor layer 24 can be effectively prevented from defects due to over-processing in the conductor process. Therefore, it is ensured that the on-state current of the active switch 2 is stable. Moreover, such arrangement can effectively reduce consumable materials for manufacturing the array substrate. The production cost of the array substrate is greatly reduced. The market competitiveness of the display panel is enhanced even further.

Wherein the active switch 2 comprises a source layer 22, a drain layer 23 and a gate layer 21. The source layer 22 and the drain layer 23 are separately connected to two ends of the semiconductor layer 24. The insulating layer 25 is disposed between the gate layer 21 and the semiconductor layer 24. The gate layer 21 may comprise a color photoresist layer disposed thereon. The active switch 2 can have very good light-shielding function. It effectively mitigates the uneven display or color mixing phenomenon. As a result, the array substrate has better display effect. Moreover, arranging the color photoresist layer and the active switch 2 to be spaced apart can define the pixels of the array substrate quite well. Therefore, the display effect of the display panel can be better controlled and adjusted. Arranging the gate layer 21 to be positioned between the source layer 22 and the drain layer 23 can also play a good light-shielding effect.

Wherein the substrate 1 comprises a light-shielding layer 11 and a buffer layer 12. The semiconductor layer 24 is formed on the buffer layer 12. The light-shielding layer 11 is positioned between the orthogonal projections of the source layer 22 and the drain layer 23 on the substrate 1. The light-shielding layer 11 fills a gap between the orthogonal projections of the source layer 22 and the drain layer 23 on the substrate 1. The substrate 1 comprises the light-shielding layer 11 disposed thereon. The arrangement of the light-shielding layer 11 can shield light from a light-emitting layer quite well. Light leakage of the display panel is effectively avoided. The light-shielding layer 11 is positioned between the orthogonal projections of the source layer 22 and the drain layer 23 on the substrate 1, and further fills the gap between the orthogonal projections of the source layer 22 and the drain layer 23 on the substrate 1. Light from the light-emitting layer first irradiates the source layer 22 and the drain layer 23. The source layer 22 and the drain layer 23 effectively block light. Light from the light-emitting layer then irradiates between the source layer 22 and the drain layer 23. The gate layer 21 is capable of blocking light well. Light, which is finally not blocked, irradiates the light-shielding layer 11. Since the light-shielding layer 11 fills the gap between the orthogonal projections of the source layer 22 and the drain layer 23 on the substrate 1, it is very effective in shielding light from the light-emitting layer. Light from the light-emitting layer is prevented from leakage at the position of the active switch 2. It effectively mitigates the uneven display or color mixing phenomenon. As a result, the array substrate has better display effect. The display effect of the array substrate is enhanced even further. It is certainly acceptable not to dispose the light-shielding layer 11 at the orthogonal projection of the gate layer 21 on the substrate 1. It can be very effective in reducing consumable materials. The production cost of the display panel can be greatly reduced. The weight of the display panel can be significantly reduced such that it is more convenient to move the display panel.

Figure 3:
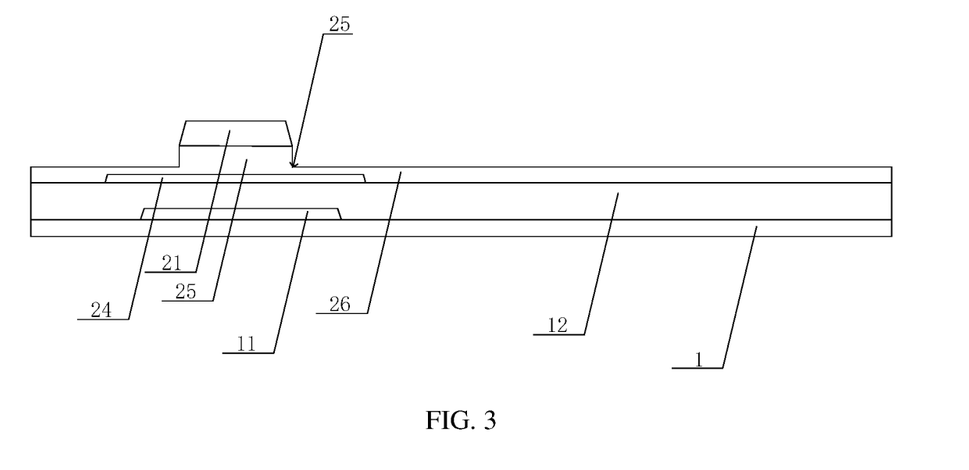
FIG. 3 is a structural schematic view of a partial cross-section of an array substrate according to an embodiment of the disclosure.

As shown in FIG. 3, the protection layer 26 is made of the same material as the insulating layer 25. The protection layer 26 and the insulating layer 25 are an integrally formed structure. The arrangement of the protection layer 26 can be beneficial to covering the semiconductor layer 24. It is ensured that the region of the semiconductor layer 24, which requires to be conductor, is not exposed. During the subsequent processes, it is effective in reducing impact on the impedance of the conductor portion of the semiconductor layer 24. Therefore, it is ensured that the on-state current of the active switch 2 is stable. The display effect of the display panel is enhanced even further. Moreover, the arrangement of the protection layer 26 can effectively avoid over-processing of the semiconductor layer 24 in the conductor process. Defect states are reduced even further. At the same time, the insulating layer 25 and the protection layer 26 are integrally arranged. As a result, they can be formed by using single mask process in the manufacturing production without increasing the difficulty of the process and the number of mask. It can be ensured that the production capacity of the display panel is high such that the display panel is more competitive in the market. The thickness of the protection layer 26 is greater than 100 nm. It is effective in preventing over-processing of the semiconductor layer 24 in the conductor process. Defect states in the display panel are reduced even further.

Wherein the active switch 2 comprises a passivation layer 14. The passivation layer 14 is disposed to cover the active switch 2. The passivation layer 14 and the protection layer 26 comprise an interlayer dielectric layer 13 disposed therebetween. By arranging the passivation layer 14 to cover the active switch 2, it can effectively prevent gas spillage problems. The gas spillage problems would be induced by corrosion of the interlayer dielectric layer 13 in the subsequent processes. The passivation layer 14 can provide the interlayer dielectric layer 13 with excellent protection. Therefore, it is ensured that the display panel has longer lifetime. There is no need to increase the process steps. Effective protection of the display panel is achieved. As a result, the display panel has better display effect. The display effect of the display panel is improved even further.

Wherein the passivation layer 14 is arranged to comprise two layers. The source layer 22 and the drain layer 23 are made of a metal material. The sides of the source layer 22 and the drain layer 23 both have metallic burrs, as viewed from a microstructure. By arranging two layers of the passivation layer 14, the metallic burrs on the source layer 22 and the drain layer 23 are covered much well. It is very effective to prevent the metal burrs from being exposed outside of the passivation layer 14. As a result, the passivation layer 14 can provide the source layer 22 and the drain layer 23 with better protection. It is effective in preventing the source layer 22 and the drain layer 23 from be influenced by the subsequent processes. Therefore, the yield of the array substrate is greatly enhanced. The color photoresist layer can be arranged between the two layers of the passivation layer 14. The two layers of the passivation layer 14 provide the color photoresist layer with excellent protection. It effectively prevents an organic material of the color photoresist layer from releasing gas comprising some harmful impurities. Accordingly, effective protection of the display panel is achieved. The efficiency and lifetime of the display panel is increased.

Wherein the semiconductor layer 24 is made of an oxide semiconductor material. The oxide semiconductor material may be ZnO, Zn—Sn—O, In—Zn—O, MgZnO, In—Ga—O, $InO_3$, and so on. These materials may be prepared by using a magnetron sputtering process, a pulsed laser deposition process, an electron beam evaporation process, and so on. The exemplary amorphous silicon has problems comprising low carrier mobility and strong photosensitivity. Compared with the exemplary amorphous silicon, the semiconductor layer 24 has a higher carrier mobility and has significant advantages in uniformity, stability, and so on. It shows a great prospect of application. The active switch 2 is manufactured by using an oxide semiconductor material as the semiconductor layer 24. As a result, the active switch 2 has a higher switching current ratio and a higher field-effect mobility. The response speed is fast. Larger drive current can be achieved. A display panel with a large area can be manufactured. Moreover, the active switch 2, which is manufactured by using an oxide semiconductor material as the semiconductor layer 24, can be prepared at room temperature. Since the process temperature is low, flexible substrates can be used. As a result, flexible displays are developed. Flexible display technology has advantages comprising more portable, lighter, more dropping-resistant, and so on. Therefore, the oxide semiconductor material is very suitable for the semiconductor material of flexible displays.

Alternatively, the oxide semiconductor material may be an indium gallium zinc oxide material. Using the indium gallium zinc oxide material as the semiconductor layer 24 can be very effective in reducing the power consumption of the display panel. Therefore, it reduces more electric power consumption. It is energy efficient and environmental-friendly. Moreover, its carrier mobility is 20~30 times the amorphous silicon. The active switch 2 has greatly improved charge and discharge rates of pixel electrodes. The response speed of pixels is enhanced. Faster refresh rate is achieved. At the same time, line-scan rate of pixels is also enhanced due to the faster response. As a result, the resolution can reach Full HD or even Ultra Definition levels. In addition, due to the reduction in the number of transistors and the increased light transmittance of each pixel, display panel has a higher level of energy efficiency, and is more efficient. At the same time, using amorphous silicon production line in the fabrication only needs few modifications. Accordingly, it is more competitive in cost than low-temperature polysilicon.

Figure 4:
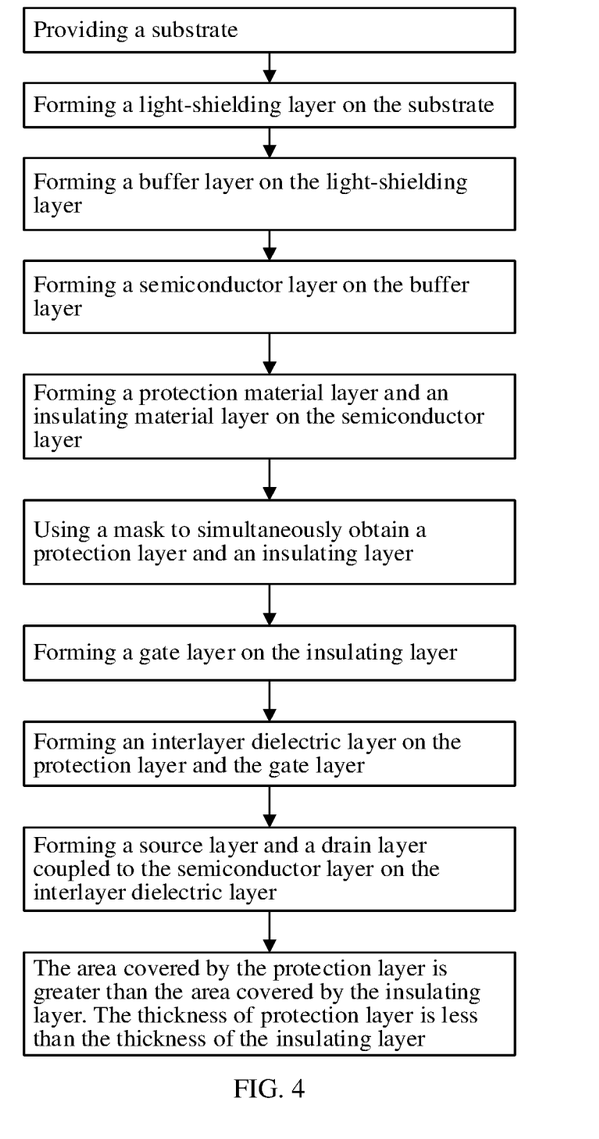
FIG. 4 is a flow chart of a method for forming an array substrate according to an embodiment of the disclosure.

As shown in FIGS. 3 and 4, according to another aspect of the disclosure, the disclosure also provides a method for forming an array substrate according to an embodiment of the disclosure, comprising the steps of:

S41: Providing a substrate.

S42: Forming a light-shielding layer on the substrate.

S43: Forming a buffer layer on the light-shielding layer.

S44: Forming a semiconductor layer on the buffer layer.

S45: Forming a protection material layer and an insulating material layer on the semiconductor layer.

S46: Using a mask to simultaneously obtain a protection layer and an insulating layer.

S47: Forming a gate layer on the insulating layer.

S48: Forming an interlayer dielectric layer on the protection layer and the gate layer.

S49: Forming a source layer and a drain layer coupled to the semiconductor layer on the interlayer dielectric layer.

S50: The area covered by the protection layer is greater than the area covered by the insulating layer. The thickness of protection layer is less than the thickness of the insulating layer.

The same mask is used to etch the insulating material layer and the protection material layer. The insulating material layer is first etched and then the protection material layer is etched so as to obtain the insulating layer 25 and the protection layer 26. The protection layer 26 effectively ensures that the region of the semiconductor layer 24, which requires to be conductor, is not exposed. During the subsequent processes, it is effective in reducing impact on the impedance of the conductor portion of the semiconductor layer 24. Therefore, it is ensured that the on-state current of the active switch 2 is stable. The display effect of the display panel is enhanced even further. Moreover, since the insulating layer 25 covers the semiconductor layer 24, it is effective in avoiding over-processing of the semiconductor layer 24 in the conductor process. Defect states are reduced even further. At the same time, such arrangement does not increase the difficulty of the process and the number of mask. There is no impact on the production capacity of the display panel, either.

Figure 5:
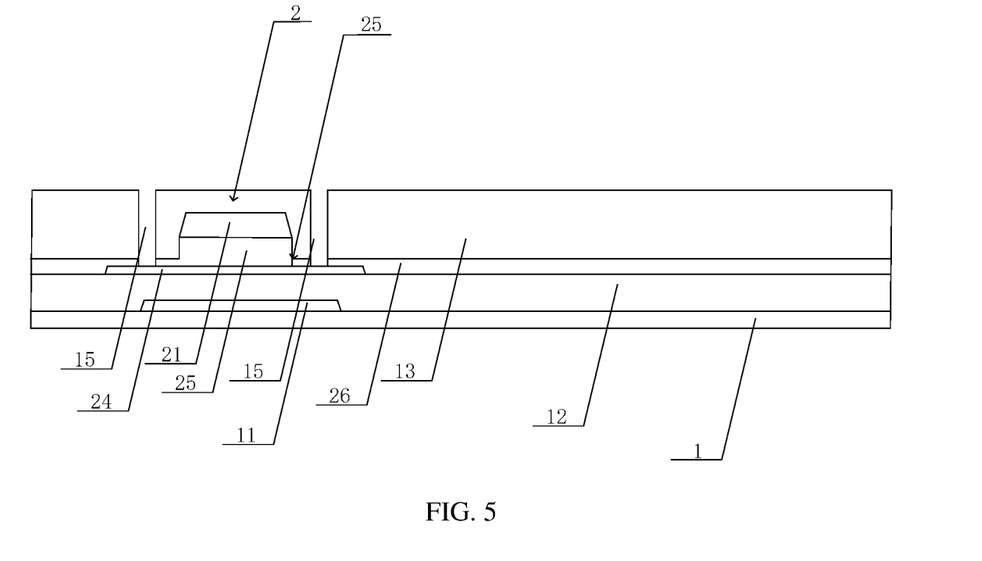
FIG. 5 is a structural schematic view of a partial cross-section of an array substrate according to an embodiment of the disclosure.
Figure 6:
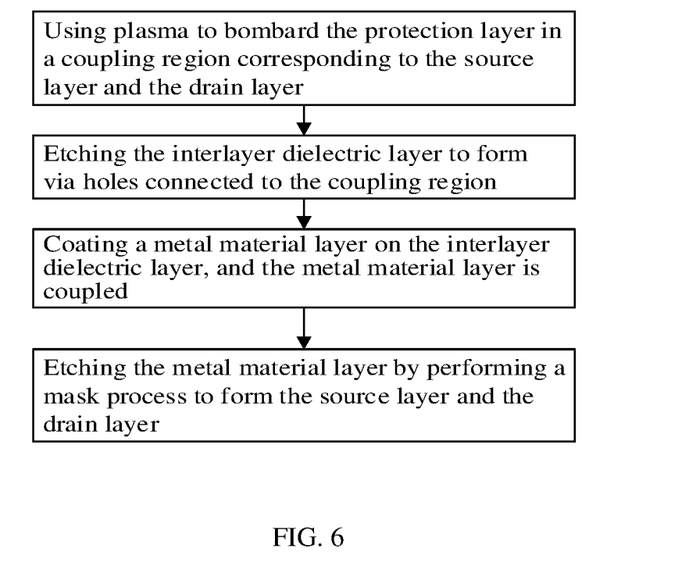
FIG. 6 is a flow chart of a method for forming an array substrate according to an embodiment of the disclosure.

As shown in FIGS. 5 and 6, the formation of the source layer and the drain layer coupled to the semiconductor layer on the interlayer dielectric layer comprises the steps of:

S61: Using plasma to bombard the protection layer in a coupling region corresponding to the source layer and the drain layer.

S62: Etching the interlayer dielectric layer to form via holes connected to the coupling region.

S63: Coating a metal material layer on the interlayer dielectric layer, wherein the metal material layer is coupled to the semiconductor layer through the via holes.

S64: Etching the metal material layer by performing a mask process to form the source layer and the drain layer.

The surface of the protection layer 26 is physically bombarded with plasma containing an inert gas such as Ar, He, etc., or doped with $NH_3$, $H_2$, etc. in plasma. As a result, the region of the semiconductor layer 24, which requires to be conductor, is conductorized, thereby obtaining the conductorized semiconductor layer 24. The protection layer 26 formed on the semiconductor layer 24 can effectively avoid over-processing of the oxide semiconductor in the conductor treatment. Defect states are reduced. As a result, the semiconductor layer 24 has a higher carrier mobility. Furthermore, the semiconductor layer 24 has a higher switching current ratio and a higher field-effect mobility. The response speed is fast. Larger drive current can be achieved. A display panel with a large area can be manufactured.

One end of the source layer 22 and the drain layer 23 is arranged between the passivation layer 14 and the interlayer dielectric layer 13. The other end of the source layer 22 and the drain layer 23 passes through the interlayer dielectric layer 13 to be connected to the semiconductor layer 24. The interlayer dielectric layer 13 and the protection layer 26 are etched to form via holes 15. It facilitates the other end of the source layer 22 and the drain layer 23 being connected to the semiconductor layer 24. As a result, good operation performance of the active switch 2 is realized.

The protection layer 26 is made of the same material as the insulating layer 25. Accordingly, it is convenient for simultaneous production of the protection layer 26 and the insulating layer 25, thereby facilitating further reducing the fabrication cost.

In the above-mentioned embodiments, the material of the substrate may be glass, plastic, and so on.

In the above-mentioned embodiments, the display panel comprises liquid crystal display panel, plasma display panel, OLED (Organic Light-Emitting Diode), QLED (Quantum Dots Light-Emitting Diode), and other display panel. Taking liquid crystal display panel as examples, the liquid crystal panel comprises an array substrate and a Color Filter (CF) substrate. The array substrate and the CF substrate are arranged to be opposite. Liquid crystal and spacers (photo spacers, PS) are arranged between the array substrate and the CF substrate. The array substrate comprises thin film transistors (TFT) disposed thereon. The CF substrate comprises a color filter layer disposed thereon.

In the above-mentioned embodiments, the CF substrate may comprise TFT arrays. The color filter and the TFT arrays may be formed on the same substrate. The array substrate may comprise a color filter layer.

In the above-mentioned embodiments, the display panel of the disclosure may be a curved type panel.

The foregoing contents are detailed description of the disclosure in conjunction with specific preferred embodiments and concrete embodiments of the disclosure. The disclosure is not limited to these descriptions. For the person skilled in the art of the disclosure, without departing from the concept of the disclosure, simple deductions or substitutions can be made and should be included in the protection scope of the disclosure.

What is claimed is:

1. An array substrate, comprising:
   a substrate;
   a light-shielding layer formed on the substrate;
   a buffer layer formed on the light-shielding layer;
   a semiconductor layer formed on the buffer layer;
   a protection layer formed on the semiconductor layer;
   an insulating layer formed on the protection layer; and
   an interlayer dielectric layer formed on the protection layer;
   wherein the substrate comprises a source layer, a drain layer and a gate layer disposed thereon, and the source layer and the drain layer are formed on the interlayer dielectric layer, and the source layer and the drain layer are separately connected to conductor portions on two ends of the semiconductor layer,
   wherein the insulating layer is disposed between the gate layer and the semiconductor layer, and the interlayer dielectric layer is disposed to cover the gate layer and the protection layer, and an area covered by the protection layer is greater than an area covered by the insulating layer, and a thickness of protection layer is less than a thickness of the insulating layer,
   wherein the protection layer covers an entire surface of the semiconductor layer, and the protection layer comprises two via holes, and the two via holes are disposed on two sides of the insulating layer,
   wherein an orthogonal projection region of the protection layer on the substrate overlaps an orthogonal projection region of the semiconductor layer on the substrate,
   wherein the source layer and the drain layer comprise a passivation layer disposed thereon, and the passivation layer is disposed to cover the source layer and the drain layer, and the passivation layer and the protection layer comprise the interlayer dielectric layer disposed therebetween,
   wherein the protection layer is made of the same material as the insulating layer, and the semiconductor layer is made of an oxide semiconductor material.

2. An array substrate, comprising:
   a substrate;
   a light-shielding layer formed on the substrate;
   a buffer layer formed on the light-shielding layer;
   a semiconductor layer formed on the buffer layer;
   a protection layer formed on the semiconductor layer;
   an insulating layer formed on the protection layer; and
   an interlayer dielectric layer formed on the protection layer;
   wherein the substrate comprises a source layer, a drain layer and a gate layer disposed thereon, and the source layer and the drain layer are formed on the interlayer dielectric layer, and the source layer and the drain layer are separately connected to conductor portions on two ends of the semiconductor layer,
   wherein the insulating layer is disposed between the gate layer and the semiconductor layer, and the interlayer dielectric layer is disposed to cover the gate layer and the protection layer, and an area covered by the protection layer is greater than an area covered by the insulating layer, and a thickness of protection layer is less than a thickness of the insulating layer;
   wherein the protection layer covers an entire surface of the semiconductor layer, and the protection layer comprises two via holes, and the two via holes are disposed on two sides of the insulating layer.

3. The array substrate as claimed in claim 2, wherein an orthogonal projection region of the protection layer on the substrate overlaps an orthogonal projection region of the semiconductor layer on the substrate.

4. The array substrate as claimed in claim 3, wherein the protection layer is made of the same material as the insulating layer, and wherein the protection layer and the insulating layer are an integrally formed structure.

5. The array substrate as claimed in claim 3, wherein the source layer and the drain layer comprise a passivation layer disposed thereon, and the passivation layer is disposed to cover the source layer and the drain layer, and wherein the passivation layer and the protection layer comprise the interlayer dielectric layer disposed therebetween.

6. The array substrate as claimed in claim 3, wherein the semiconductor layer is made of an oxide semiconductor material.

7. The array substrate as claimed in claim 2, wherein the protection layer is made of the same material as the insulating layer, and wherein the protection layer and the insulating layer are an integrally formed structure.

8. The array substrate as claimed in claim 2, wherein the source layer and the drain layer comprise a passivation layer disposed thereon, and the passivation layer is disposed to cover the source layer and the drain layer, and wherein the passivation layer and the protection layer comprise the interlayer dielectric layer disposed therebetween.

9. The array substrate as claimed in claim 2, wherein the semiconductor layer is made of an oxide semiconductor material.

10. An array substrate, comprising:
    a substrate;
    a light-shielding layer formed on the substrate;
    a buffer layer formed on the light-shielding layer;
    a semiconductor layer formed on the buffer layer;
    a protection layer formed on the semiconductor layer;
    an insulating layer formed on the protection layer; and an interlayer dielectric layer formed on the protection layer;

wherein the substrate comprises a source layer, a drain layer and a gate layer disposed thereon, and the source layer and the drain layer are formed on the interlayer dielectric layer, and the source layer and the drain layer are separately connected to conductor portions on two ends of the semiconductor layer, wherein the insulating layer is disposed between the gate layer and the semiconductor layer, and the interlayer dielectric layer is disposed to cover the gate layer and the protection layer, and an area covered by the protection layer is greater than an area covered by the insulating layer, and a thickness of protection layer is less than a thickness of the insulating layer;

wherein the protection layer is made of the same material as the insulating layer, and wherein the protection layer and the insulating layer are an integrally formed structure.

11. The array substrate as claimed in claim 10, wherein the source layer and the drain layer comprise a passivation layer disposed thereon, and the passivation layer is disposed to cover the source layer and the drain layer, and wherein the passivation layer and the protection layer comprise the interlayer dielectric layer disposed therebetween.

12. The array substrate as claimed in claim 10, wherein the semiconductor layer is made of an oxide semiconductor material.

13. The array substrate as claimed in claim 10, wherein the source layer and the drain layer comprise a passivation layer disposed thereon, and the passivation layer is disposed to cover the source layer and the drain layer, and wherein the passivation layer and the protection layer comprise the interlayer dielectric layer disposed therebetween.

14. The array substrate as claimed in claim 10, wherein the semiconductor layer is made of an oxide semiconductor material.

* * * * *